(12) United States Patent
Bouthinon et al.

(10) Patent No.: US 11,569,297 B2
(45) Date of Patent: Jan. 31, 2023

(54) IMAGE SENSOR

(71) Applicant: ISORG, Limoges (FR)

(72) Inventors: Benjamin Bouthinon, Grenoble (FR);
Emeline Saracco, Grenoble (FR);
Jean-Yves Gomez, Grenoble (FR);
Olivier Dhez, Grenoble (FR)

(73) Assignee: ISORG, Limoges (FR)

( * ) Notice: Subject to any disclaimer, the term of this patent is extended or adjusted under 35 U.S.C. 154(b) by 164 days.

(21) Appl. No.: 16/956,515

(22) PCT Filed: Nov. 16, 2018

(86) PCT No.: PCT/FR2018/052894
§ 371 (c)(1),
(2) Date: Jun. 19, 2020

(87) PCT Pub. No.: WO2019/122557
PCT Pub. Date: Jun. 27, 2019

(65) Prior Publication Data
US 2022/0140005 A1    May 5, 2022

(30) Foreign Application Priority Data

Dec. 21, 2017 (FR) ...................... 1762783

(51) Int. Cl.
*H01L 27/30* (2006.01)
(52) U.S. Cl.
CPC ................ *H01L 27/307* (2013.01)

(58) Field of Classification Search
CPC ..... H01L 27/307; H01L 27/146–14656; H01L 27/14643
See application file for complete search history.

(56) References Cited

U.S. PATENT DOCUMENTS

| 9,417,731 | B2 | 8/2016 | Gomez et al. | |
| 2007/0108484 | A1* | 5/2007 | Nagamune | H01L 31/113 257/E31.093 |
| 2009/0090903 | A1 | 4/2009 | Kim et al. | |
| 2014/0375826 | A1* | 12/2014 | Lee | H01L 27/307 257/40 |
| 2015/0060775 | A1 | 3/2015 | Liang et al. | |
| 2017/0336682 | A1* | 11/2017 | Lin | G02F 1/133345 |
| 2018/0219046 | A1* | 8/2018 | Yamaguchi | H01L 27/1463 |

FOREIGN PATENT DOCUMENTS

| CN | 104733489 A * | 6/2015 |
| WO | 99/39372 A2 | 8/1999 |

OTHER PUBLICATIONS

English Translation of Written Opinion issued in PCT Patent Application PCT/FR2018/052894 dated Mar. 19, 2019.
Authorized Officer: Konigstein,, International Search Report issued in corresponding PCT application No. PCT/FR2018/052894, dated Mar. 19, 2019, 3 pp.

(Continued)

*Primary Examiner* — Khaja Ahmad
*Assistant Examiner* — Pavel G Ivanov
(74) *Attorney, Agent, or Firm* — Kaplan Breyer Schwarz, LLP

(57) ABSTRACT

An image sensor includes an array of readout circuits in non-organic technology and photodiodes made of organic materials.

6 Claims, 3 Drawing Sheets

(56) References Cited

OTHER PUBLICATIONS

Hukuto Seo et al., "Color Sensors with Three Vertically Stacked Organic Photodetectors", "Japanese Journal of Applied Physics", Dec. 14, 2007, DOI: 10.1143/JJAP.46.L1240, pp. L1240-L1242, vol. 47, No. 49.
Alain E. Kaloyeros et al, "Review—Silicon Nitride and Silicon Nitride-Rich Thin Film Technologies: Trends in Deposition Techniques and Related Applications", "ECS Journal of Solid State Science and Technology", Sep. 29, 2017, ISSN: 2162-8769, DOI: 10.1149/2.0011710jss, pp. P691-P714, vol. 6, No. 10.
Daniela Baierl et al., "A hybrid CMOS-imager with a solution-processable polymer as photoactive layer", "Nature Communications", Nov. 6, 2012, DOI: 10.1038/ncomms2180, pp. 1175-11788, vol. 3.
Office Action issued in counterpart European patent application No. 18206874.2, dated May 10, 2021, 12 pp. w/ translation.
English translation of Office Action issued in European patent application No. 20186121.8, dated Aug. 24, 2022, 5 pp.

\* cited by examiner

IMAGE SENSOR

The present patent application claims the priority benefit of French patent application 17/62783 which is herein incorporated by reference.

BACKGROUND

The present disclosure relates to an image sensor or electronic imager. The present disclosure more particularly relates to devices comprising an organic photodetector.

DISCUSSION OF THE RELATED ART

Image sensors are used in many fields, particularly in electronic devices due to their miniaturization. Image sensors can be found in man-machine interface applications as well as in image capture applications.

The present disclosure more particularly relates to image sensors formed from a photodetector made of organic materials.

An example of a photodetector made of organic materials is described in document U.S. Pat. No. 9,417,731.

Document US 2015/060775 describes an organic photodiode with a double electron blocking layer.

Document US 2009/090903 describes a CMOS image sensor having thiophene derivatives.

Document WO 99/39372 describes image sensors formed from organic semiconductors.

SUMMARY

An embodiment overcomes all or part of the disadvantages of image sensors integrating a photodetector made of organic materials.

An embodiment provides a solution avoiding the use of organic technologies for the entire image sensor.

Thus, an embodiment provides an image sensor comprising an array of readout circuits in non-organic technology and photodiodes made of organic materials.

According to an embodiment, the readout circuits are in CMOS technology.

According to an embodiment, each photodiode is separated from the next photodiodes by spacers made of an electrically-insulating material.

According to an embodiment, the spacers are made of a transparent material.

According to an embodiment, the spacers are opaque to light.

According to an embodiment, the spacers absorb light.

According to an embodiment, each photodiode comprises a first electrode having the size of a pixel or sub-pixel of the associated readout circuit.

According to an embodiment, the first electrode is connected to the gate of a first transistor of the readout circuit.

According to an embodiment, the first electrode is coupled to a gate of a first transistor of the readout circuit via one or a plurality of additional transistors.

According to an embodiment, a second electrode of the photodiodes is common to a plurality of readout circuits.

According to an embodiment, the second electrode is formed of a transparent organic conductive layer.

According to an embodiment, each pixel or sub-pixel is inscribed within a square having an approximately 50-μm side length.

According to an embodiment, the pixels or sub-pixels are laterally spaced apart by less than 5 μm.

According to an embodiment, the second electrode is covered with a translucent protection layer.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION

Figure 1:
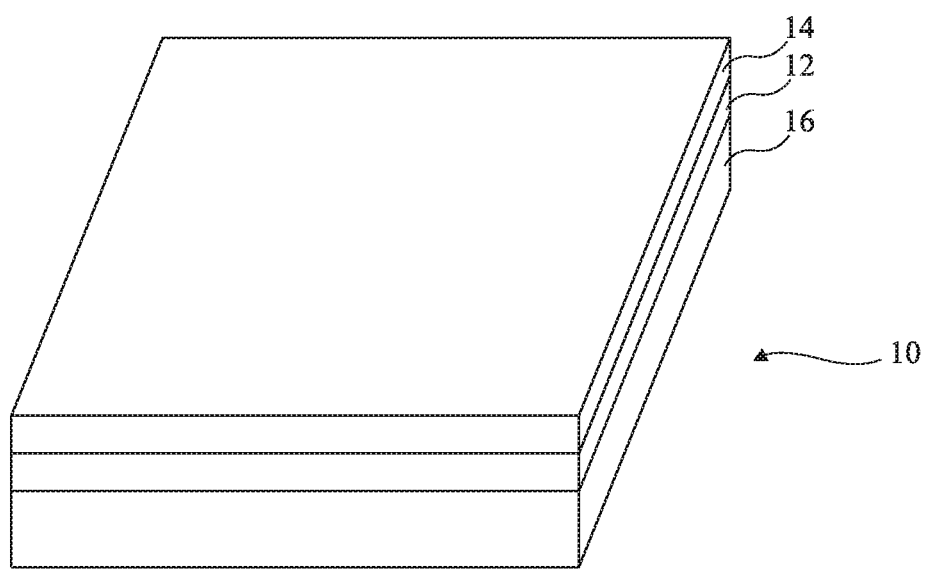
FIG. 1 is a perspective view schematically showing an embodiment of an image sensor.

The same elements have been designated with the same reference numerals in the different drawings.

For clarity, only those steps and elements which are useful to the understanding of the embodiments which will be described have been shown and will be detailed. In particular, the operation of the image sensor has not been detailed, the described embodiments being compatible with usual sensors, be they pure image sensors or sensors integrating a display. Further, the other components of the electronic device integrating the image sensor have not been detailed either, the described embodiments being compatible with the other usual components of electronic devices with an image sensor application.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following description, when reference is made to the terms "approximately", "about", and "in the order of", this means within 10%, preferably within 5%.

Further, in the following description, when reference is made to terms qualifying absolute positions, such as terms "high", "low", "left", "right", etc., or relative positions, such a terms "above", "under", "upper", "lower", etc., or to terms qualifying orientation, such as term "horizontal", "vertical", unless otherwise specified, reference is made to the orientation of the drawings.

FIG. 1 is a perspective view schematically showing an example of an image sensor 10.

Sensor 10 comprises an assembly of photon sensors, or photodetectors 12, for example, a photodetector array. In this example, photodetectors 12 are arranged on a planar surface. Embodiments may however be provided where photodetectors 12 are arranged on a non-planar surface. Photodetector array 12 may be topped with a transparent or translucent protection coating 14, for example, a glass plate, a plastic coating, a deposit by using a technology of successive depositions of atomic monolayers or a deposition of one or a plurality of other passivation layers. Photodetector array 12 is associated with an array of readout circuits 16, for measuring the signals captured by the photodetectors. Readout circuit means an assembly of transistors for reading out, addressing, and controlling the pixel or sub-pixel defined by the corresponding photodetector. Such a circuit may be integrated on the same silicon surface as the pixel array or network, or be a circuit or an assembly of electronic circuits associated with the pixel array.

According to the photodetectors used in array 12 and to the possible presence of filters, device 10 is capable of capturing shadows, infrared images, black and white images, color images (RGB), etc.

Image sensor 10 may further be associated with a display, to form an interactive interface.

The embodiments described hereafter apply to all these applications, including combined.

Organic sensors are generally arranged with first electrodes forming strips along a first direction, second electrodes forming strips along a second direction, and with the active material therebetween. Each pixel of the sensor comprises a photodetector element made of organic materials at the intersection between the electrode strips. The circuits for interpreting the signals across the electrodes are generally external to the plane of the pixel array.

Figure 2:
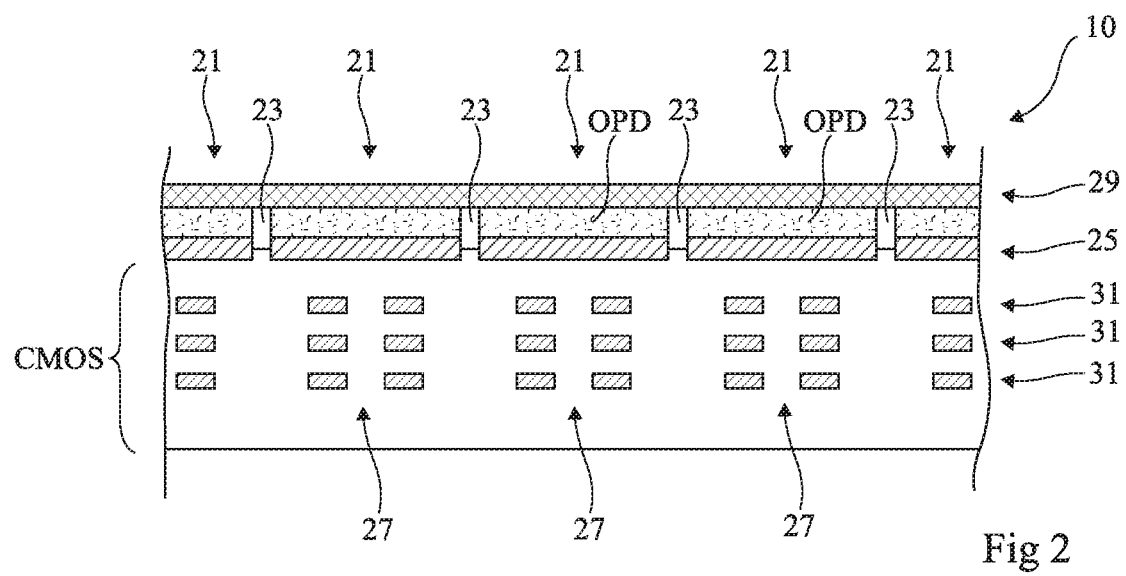
FIG. 2 is a cross-section view of an embodiment of an image sensor.

FIG. 2 is a partial cross-section view of an embodiment of an image sensor 10.

Figure 3:
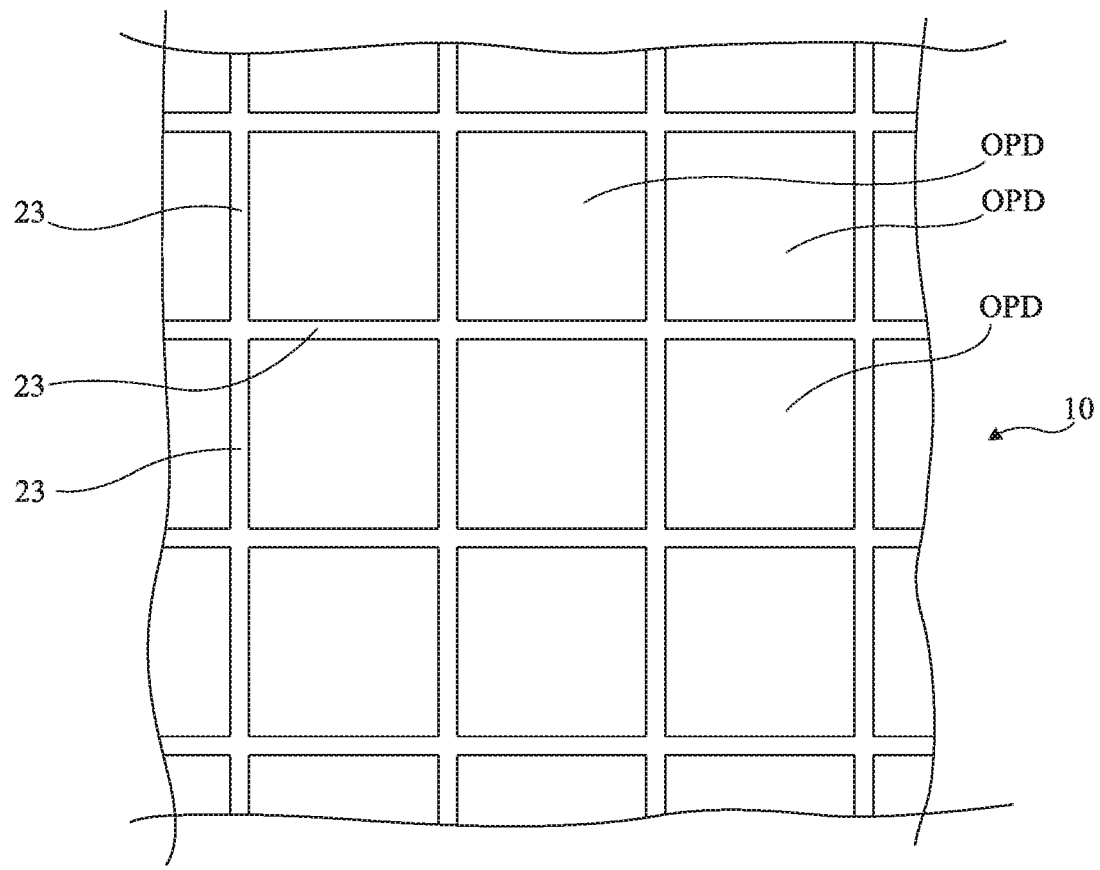
FIG. 3 is a simplified top view of the image sensor of FIG. 2.

FIG. 3 is a simplified top view of the image sensor of FIG. 2, at the level of organic elements 10.

According to the described embodiments, it is provided to form an image sensor by associating photodetectors or organic photodiodes OPD and non-organic readout circuits, in CMOS technology on a semiconductor substrate. More particularly, it is provided to stack an array of organic photodiodes OPD on an array of CMOS readout circuits, or CMOS pixels, each photodiode forming the detection element of a pixel 21 or of a sub-pixel of the image sensor.

All that will be described hereafter in relation with a pixel more generally applies to a sub-pixel, in particular for a color image sensor having each pixel generally formed of four sub-pixels.

As illustrated in FIGS. 2 and 3, each photodiode is separated from the neighboring photodiodes by a spacer 23. Thus, spacers 23 delimit the active areas of photodiodes to electrically insulate them from one another. Spacers 23 are thus made of an electrically-insulating material.

Further, at least one of the electrode layers (typically cathode layer 25) is structured (pixelated) to define a cathode of a photodiode vertically in line with a CMOS circuit 27 of the corresponding pixel. The other electrode (anode 29) may also be pixelated, but may as a variant form strips. In the case where the anode is pixelated, the anode electrodes are however interconnected at least in a first direction to allow their biasing.

The CMOS circuits or pixels are very schematically shown, their manufacturing being usual and the described embodiments being compatible with usual CMOS circuits, formed on a silicon substrate or other, based on non-organic, semiconductor, and conductive materials. The metal interconnection levels 31 of the transistors have been symbolized in FIG. 2.

According to an embodiment, spacers 23 are made of a transparent material.

According to another embodiment, spacers 23 are preferably made of an opaque and/or light-absorbing material. This enables to take advantage of the granularity of a CMOS imager having its pixels close to one another, while avoiding light leakages from one pixel to the next pixel. Indeed, the pixels of a CMOS sensor on silicon have, as an example, an approximately 50-µm side length and are distance from one another by less than 5 µm. Now, the thickness of the active layers of an organic photodiode is generally a few µm and is thus of the same order of magnitude as the interval between two pixels. Making the spacers opaque or absorbing avoids light interferences between pixels and thus improves the definition of the image sensor.

As a specific embodiment, spacers 23 are made of resin, of fluorine-based resin or on resin based on polyimide or parylene or other insulating materials.

Figure 4:
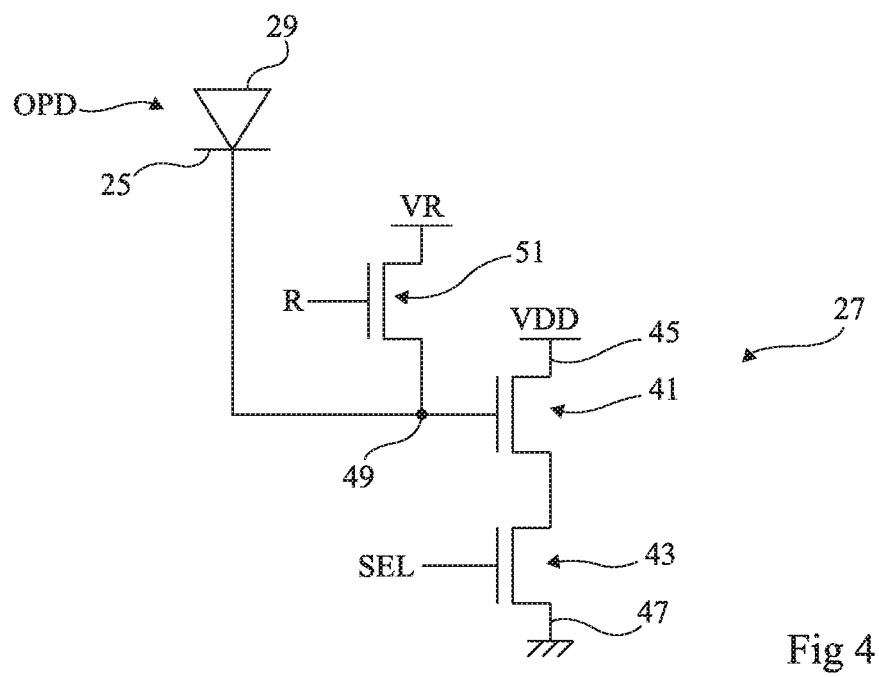
FIG. 4 shows the simplified electric diagram of a CMOS readout circuit with three transistors.

FIG. 4 shows the simplified electric diagram of a CMOS readout circuit or pixel 27 with three transistors, associated with an organic photodiode OPD.

Readout circuit 27 comprises a MOS detection transistor 41, in series with a MOS selection transistor 43, between two terminals 45 and 47 of application of a DC voltage VDD. The gate of transistor 43 is intended to receive a pixel selection signal SEL. The gate 49 of transistor 41 defines an input terminal of the CMOS circuit. Gate 49 is coupled, by a MOS reset transistor 51, to a terminal of application of a reset potential VR. The gate of transistor 51 is intended to receive a pixel reset control signal R (for discharging the gate 49 of detection transistor 41).

The gate 49 of transistor 41 is coupled to the cathode electrode 25 of the organic photodiode OPD of the considered pixel. The anode electrode 29 of photodiode OPD is coupled to a fixed potential (not shown) or to ground, but may be on order taken to different potentials.

The operation of a CMOS readout circuit is known and is not modified by the described embodiments. Further, CMOS readout transistors with four transistors (4T) where a transfer transistor is interposed between the cathode 25 of photodiode OPD and the gate 49 of detection transistor 41, or even CMOS readout transistors with more than four transistors with a plurality of additional transistors between cathode 25 and the gate of transistor 49, may be used.

Figure 5:
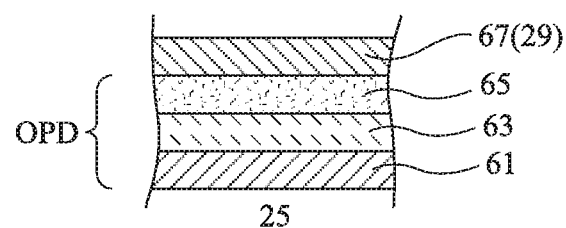
FIG. 5 very schematically shows an example of layers of an organic photodiode.

FIG. 5 very schematically illustrates an example of layers of an organic photodiode.

In this example, each organic photodiode OPD comprises a stack, in the following order from a cathode electrode 25 connected to the CMOS circuit:

a layer 61 made of a heavily-doped organic semiconductor polymer (hole donor layer);

a layer 63 made of an organic semiconductor polymer, for example poly(3-hexylthiophene) or poly(3-hexylthiophene-2,5-diyl) (P-type semiconductor), known as P3HT, or [6,6]-phenyl-$C_{61}$-methyl butanoate (N-type semiconductor), known as PCBM;

a layer 65 of heavily-doped transparent organic semiconductor polymer (electron donor layer), for example, a polymer known as Pedot-PSS, which is a mixture of poly(3,4)-ethylenedioxythiophene and of sodium polystyrene sulfonate; and a transparent layer 67, for example, made of indium-tin oxide (ITO), of Pedot-PSS, or of a transparent conductive organic material, for example, based on conductive nanowires, on graphene, or on conductive or semiconductor nanoparticles.

Cathode electrode 25 is for example made of aluminum, of silver, of ITO, of molybdenum tantalum (MoTa), of tungsten, of chromium, of Pedot-PSS, or another metal or conductive or semiconductor organic material.

Layers 61 and 65 have the function of adapting the work function between active area 63, similar to a PN junction, and the cathode and anode electrodes, respectively.

Accordingly, according to the work function of the different layers, layer 67 or layer 65 may directly form anode 29.

Similarly, according to the work function of layer 25, layer 61 may be omitted.

Organic photodiode manufacturing techniques are described, for example, in document U.S. Pat. No. 9,417,731.

An advantage of the described embodiments is that they make it possible to combine technologies of manufacturing of CMOS semiconductor readout circuits on silicon or another non-organic semiconductor substrate, and organic photodiode manufacturing technologies.

Another advantage is that makes it possible to form an infrared (around 1,400 nm) or near infrared (around 940 nm) sensor, taking into account the admissible wavelengths for the organic photodiodes and the resolution of the non-organic CMOS sensors.

Another advantage of the described embodiments is that the performed pixelization is compatible with the addition of microlenses on the anode side.

Among the applications of an image sensor or imager such as described, gaze tracking devices, facial recognition, fingerprint sensors, night vision devices, cameras, etc. should be noted.

Various embodiments have been described. Various modifications will occur to those skilled in the art. In particular, the selection of the materials forming layers 61, 63, and 65 depends on the application and particularly on the wavelengths which are desired to be detected. Further, a reflective material may be provided for cathode 25 to improve the sensitivity of the photodiodes. Gold or an alloy of tungsten and molybdenum may in particular be provided. Further, the practical implementation of the embodiments which have been described is within the abilities of those skilled in the art based on the functional indications given hereabove.

The invention claimed is:

1. An image sensor comprising an array of readout circuits in non-organic technology and photodiodes made of organic materials, wherein each of the photodiodes is separated from neighboring ones of the photodiodes by spacers made of a transparent, electrically-insulating material, which delimit active zones of the photodiodes.

2. The sensor according to claim 1, wherein the readout circuits are made in CMOS technology.

3. The sensor according to claim 1, wherein a first electrode of each photodiode is correspondingly connected to a gate of a corresponding first transistor of the readout circuits.

4. The sensor according to claim 1, wherein an electrode of the photodiodes is common to a plurality of the photodiodes.

5. The sensor according to claim 4, wherein the electrode is covered with a translucent protection layer.

6. The sensor according to claim 4, wherein the electrode is formed of a transparent organic conductive layer.

* * * * *